(12) United States Patent
Fu et al.

(10) Patent No.: US 10,938,308 B2
(45) Date of Patent: Mar. 2, 2021

(54) HYBRID DEVICES FOR BOOST CONVERTERS

(71) Applicant: Huawei Technologies Co., Ltd., Shenzhen (CN)

(72) Inventors: Dianbo Fu, Frisco, TX (US); Dong Chen, Shanghai (CN)

(73) Assignee: Futurewei Technologies, Inc., Plano, TX (US)

(*) Notice: Subject to any disclaimer, the term of this patent is extended or adjusted under 35 U.S.C. 154(b) by 0 days.

(21) Appl. No.: 16/566,102

(22) Filed: Sep. 10, 2019

(65) Prior Publication Data

US 2020/0007038 A1 Jan. 2, 2020

Related U.S. Application Data

(63) Continuation of application No. PCT/US2018/051713, filed on Sep. 19, 2018.
(Continued)

(51) Int. Cl.
*H02M 3/155* (2006.01)
*H02M 3/156* (2006.01)
*H02M 3/158* (2006.01)
*H02M 1/00* (2006.01)
*H02M 3/07* (2006.01)
*H02M 3/335* (2006.01)
*H03K 17/12* (2006.01)
(Continued)

(52) U.S. Cl.
CPC ............. *H02M 3/158* (2013.01); *H02M 3/07* (2013.01); *H02M 3/33569* (2013.01); *H03K 17/122* (2013.01); *H03K 17/127* (2013.01); *H03K 17/74* (2013.01); *H03K 2017/307* (2013.01); *H03K 2217/0036* (2013.01)

(58) Field of Classification Search
CPC ........ H02M 3/155–3/1588; H02M 2001/0051; H02M 3/156; H02M 3/158
See application file for complete search history.

(56) References Cited

U.S. PATENT DOCUMENTS 9,024,609 B2 * 5/2015 Milavec .................... H02J 1/10
323/224
9,401,635 B2 * 7/2016 Humphrey .......... H02M 1/4225
(Continued)

FOREIGN PATENT DOCUMENTS

CN       106936298 A      7/2017

OTHER PUBLICATIONS

Infineon Technologies,"OptiMOS Power-MOSFET, 40V BSZ023N04LS", XP055735161, Nov. 22, 2012,14 pages.
(Continued)

*Primary Examiner* — Thienvu V Tran
*Assistant Examiner* — Sisay G Tiku
(74) *Attorney, Agent, or Firm* — Slater Matsil, LLP

(57) ABSTRACT

A converter comprises a first switching element and a second switching element coupled between an input power source and an output capacitor and an inductor coupled to a common node of the first switching element and the second switching element, wherein the second switching element comprises a first diode and a first switch connected in series between a first terminal and a second terminal of the second switching element and a second diode connected between the first terminal and the second terminal of the second switching element.

17 Claims, 2 Drawing Sheets

Related U.S. Application Data

(60) Provisional application No. 62/562,100, filed on Sep. 22, 2017.

(51) Int. Cl.
*H03K 17/74* (2006.01)
*H03K 17/30* (2006.01)

(56) References Cited

U.S. PATENT DOCUMENTS

| | | | | |
|---|---|---|---|---|
| 9,729,055 | B1* | 8/2017 | Yao | H02M 3/156 |
| 2003/0052653 | A1* | 3/2003 | Mendenhall | H02M 1/4208 |
| | | | | 323/210 |
| 2006/0006850 | A1* | 1/2006 | Inoue | H02J 2207/20 |
| | | | | 323/265 |
| 2006/0028186 | A1* | 2/2006 | Yan | H02M 3/155 |
| | | | | 323/225 |
| 2006/0238941 | A1* | 10/2006 | Ingemi | H02J 9/062 |
| | | | | 361/92 |
| 2008/0316779 | A1* | 12/2008 | Jayaraman | H02M 3/156 |
| | | | | 363/74 |
| 2009/0027931 | A1* | 1/2009 | Usui | H02J 9/061 |
| | | | | 363/84 |
| 2009/0206812 | A1* | 8/2009 | Sasaya | H02M 3/1588 |
| | | | | 323/282 |
| 2010/0321966 | A1* | 12/2010 | Mochikawa | H02M 1/08 |
| | | | | 363/123 |
| 2011/0309874 | A1* | 12/2011 | Takimoto | H03K 17/063 |
| | | | | 327/427 |
| 2013/0134958 | A1* | 5/2013 | Mochikawa | H03K 17/687 |
| | | | | 323/311 |
| 2013/0152624 | A1* | 6/2013 | Arisawa | H02M 3/158 |
| | | | | 62/467 |
| 2014/0145208 | A1* | 5/2014 | Rose | H03K 17/567 |
| | | | | 257/77 |
| 2015/0137784 | A1* | 5/2015 | Sugawara | H02M 1/32 |
| | | | | 323/282 |
| 2015/0340951 | A1* | 11/2015 | Wu | H02M 3/158 |
| | | | | 323/271 |
| 2016/0276927 | A1* | 9/2016 | Das | H02M 1/44 |
| 2016/0285386 | A1* | 9/2016 | Kataoka | H03K 17/122 |
| 2016/0329846 | A1* | 11/2016 | Shimomugi | F24F 7/007 |
| 2017/0040890 | A1* | 2/2017 | Barkley | H02M 3/155 |
| 2017/0302169 | A1* | 10/2017 | Yamada | H02M 7/12 |
| 2017/0302181 | A1* | 10/2017 | Shimizu | H02M 3/158 |
| 2017/0302196 | A1* | 10/2017 | Weng | H02M 1/08 |
| 2017/0338815 | A1* | 11/2017 | Laven | H01L 25/072 |
| 2018/0182844 | A1* | 6/2018 | Nakamura | H01L 29/36 |
| 2018/0316342 | A1* | 11/2018 | Fu | H03K 17/06 |
| 2019/0190259 | A1* | 6/2019 | Ludwig | H02M 1/08 |

OTHER PUBLICATIONS

Infineon Technologies, "650V CoolMOS C6 Power Transistor IPW65R037C6", XP055735164, Oct. 13, 2011, 15 pages.

* cited by examiner

HYBRID DEVICES FOR BOOST CONVERTERS

CROSS REFERENCE TO RELATED APPLICATIONS

This application a continuation of Application No. PCT/US2018/051713, entitled "Hybrid Boost Converters" and filed on Sep. 19, 2018, which claims priority to U.S. Provisional Application Ser. No. 62/562,100, entitled, "Hybrid Boost Converters" and filed on Sep. 22, 2017, which application is hereby incorporated herein by reference.

TECHNICAL FIELD

The present disclosure relates to a hybrid boost converter, and, in particular embodiments, to a hybrid boost converter having lower switching and conduction losses.

BACKGROUND

Renewable energy sources include solar energy, wind power, tidal wave energy and the like. A solar power conversion system may include a plurality of solar panels connected in series or in parallel. The output of the solar panels may generate a variable dc voltage depending on a variety of factors such as time of day, location and sun tracking ability. In order to regulate the output of the solar panels, the output of the solar panels may be coupled to a direct current/direct current (dc/dc) converter so as to achieve a regulated output voltage at the output of the dc/dc converter. In addition, the solar panels may be connected with a backup battery system through a battery charge control apparatus. During the day, the backup battery is charged through the output of the solar panels. When the power utility fails or the solar panels are an off-grid power system, the backup battery provides electricity to the loads coupled to the solar panels.

Since the majority of applications may be designed to run on 120 volts ac power, a solar inverter is employed to convert the variable dc output of the photovoltaic modules to a 120 volts ac power source. A plurality of multilevel inverter topologies may be employed to achieve high power as well as high efficiency conversion from solar energy to utility electricity. In particular, a high power alternating current (ac) output can be achieved by using a series of power semiconductor switches to convert a plurality of low voltage dc sources to a high power ac output by synthesizing a staircase voltage waveform.

Boost converters may be employed to generate additional voltage levels so as to form the staircase voltage waveform of the multilevel inverters. The boost converters may be implemented by using step up circuits such as non-isolated boost converters. A non-isolated boost converter is formed by an input inductor, a low side switch, a blocking diode and an output capacitor. The input inductor is coupled between an input power source and a common node of the low side switch and the blocking diode. The output capacitor is connected to the blocking diode and ground.

The blocking diode of the boost converter may be implemented as a silicon carbide diode or a silicon diode. The silicon carbide diode has a high forward voltage drop, which may increase the conduction losses of the boost converter. The silicon diode may have poor reverse recovery performance, which may cause additional switching losses. It would be desirable to have a hybrid device exhibiting good behaviors such as low forward voltage drop and fast reverse recovery.

SUMMARY

These and other problems are generally solved or circumvented, and technical advantages are generally achieved, by preferred embodiments of the present disclosure which provide a hybrid boost converter having lower switching and conduction losses.

In accordance with an embodiment, a converter comprises a first switching element and a second switching element coupled between an input power source and an output capacitor. The converter further comprises an inductor coupled to a common node of the first switching element and the second switching element. The second switching element comprises a first diode and a first switch connected in series between a first terminal and a second terminal of the second switching element, and a second diode connected between the first terminal and the second terminal of the second switching element.

In accordance with another embodiment, a method comprises turning off a first switch of a power converter. The power converter comprises an inductor coupled to a common node of the first switch and a second switch of the power converter. During a first dead time after turning off the first switch, a current flows through a first diode. The first diode has an anode connected to the second switch. After the first dead time, the second switch is turned on. During a second dead time after turning off the second switch, the current flows through the first diode.

In accordance with yet another embodiment, an apparatus comprises a first switch having a first terminal coupled to a positive terminal of a power source through an inductor and a second terminal coupled to a negative terminal the power source. The apparatus further comprises a second switch and a first diode connected in series and further coupled between the inductor and an output capacitor. The apparatus further comprises a second diode coupled between a common node of the first switch and the second switch, and the output capacitor.

An advantage of an embodiment of the present disclosure is a hybrid boost converter providing lower conduction and switching losses so as to improve the efficiency, reliability and cost of the boost converter.

The foregoing has outlined rather broadly the features and technical advantages of the present disclosure in order that the detailed description of the disclosure that follows may be better understood. Additional features and advantages of the disclosure will be described hereinafter which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to preferred embodiments in a specific context, namely a hybrid boost converter. The present disclosure may also be applied, however, to a variety of power converters. Hereinafter, various embodiments will be explained in detail with reference to the accompanying drawings.

Figure 1:
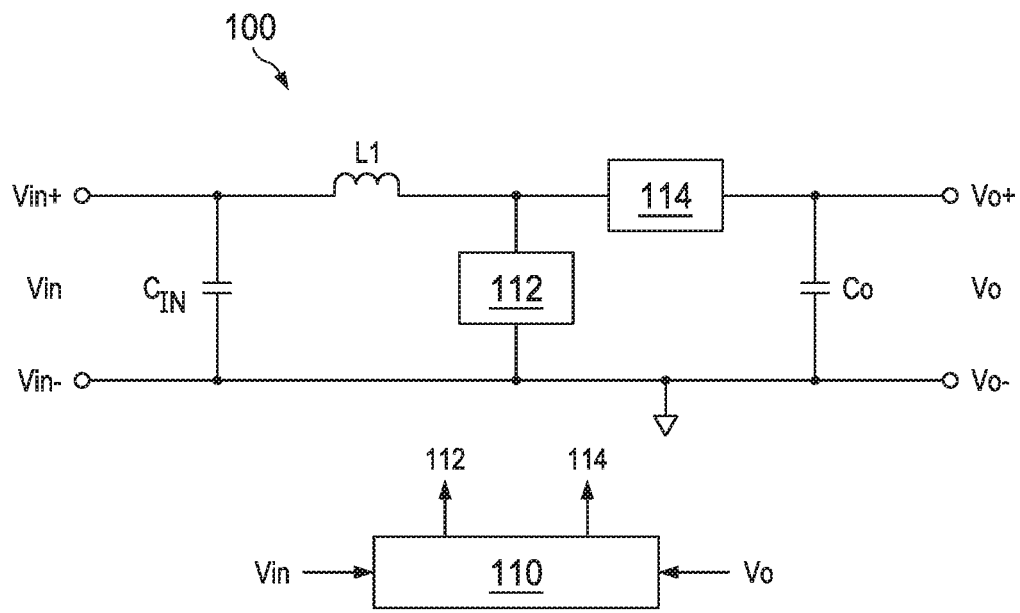
FIG. 1 illustrates a block diagram of a boost converter in accordance with various embodiments of the present disclosure.

FIG. 1 illustrates a block diagram of a boost converter in accordance with various embodiments of the present disclosure. The boost converter 100 comprises a first switching element 112, a second switching element 114, an inductor L1, an input capacitor $C_{IN}$ and an output capacitor Co. As shown in FIG. 1, the inductor L1 is connected to a common node of the first switching element 112 and the second switching element 114. The inductor L1 and the second switching element 114 are connected between the input capacitor $C_{IN}$ and the output capacitor Co. The first switching element 112 is connected between the common node of the inductor L1 and the second switching element 114 and ground.

The boost converter 100 may further comprise a controller 110. As shown in FIG. 1, the controller 110 may detect the input voltage Vin, the output voltage Vo, and generate two gate drive signals for controlling the on and off of the first switching element 112 and the second switching element 114 respectively. The controller 110 may be a pulse width modulation (PWM) controller. Alternatively, the controller 110 may be implemented as a digital controller such as a micro-controller, a digital signal processor and/or the like.

It should be noted that while the example throughout the description is based upon a boost converter and a controller configured to generate the gate drive signals for the boost converter (e.g., the boost converter 100 shown in FIG. 1), the boost converter 100 as well as the controller 110 shown in FIG. 1 may have many variations, alternatives, and modifications. For example, the controller 110 may detect other necessary signals such as the input and/or output current, the drain-to-source voltages of the boost converter 100, the temperature of the boost converter 100 and the like. Furthermore, there may be one dedicated driver or multiple dedicated drivers coupled between the controller 110, and the first switching element 112 and the second switching element 114.

The boost converter 100 and the controller 110 illustrated herein is limited solely for the purpose of clearly illustrating the inventive aspects of the various embodiments. The present invention is not limited to any particular power topology.

The first switching element 112 and the second switching element 114 shown in FIG. 1 may be implemented as n-type metal oxide semiconductor (NMOS) transistors. Alternatively, the switches may be implemented as other suitable controllable devices such as metal oxide semiconductor field effect transistor (MOSFET) devices, bipolar junction transistor (BJT) devices, super junction transistor (SJT) devices, insulated gate bipolar transistor (IGBT) devices, gallium nitride (GaN) based power devices and/or the like.

Furthermore, at least one of the first switching element 112 and the second switching element 114 may be implemented as a hybrid device including a combination of a plurality of switching devices (e.g., a combination of a MOSFET device and a plurality of diodes). The detailed structures of the plurality of switching devices will be described below with respect to FIG. 2. Throughout the description, the boost converter 100 may be alternatively referred to as a hybrid boost converter 100.

Figure 2:
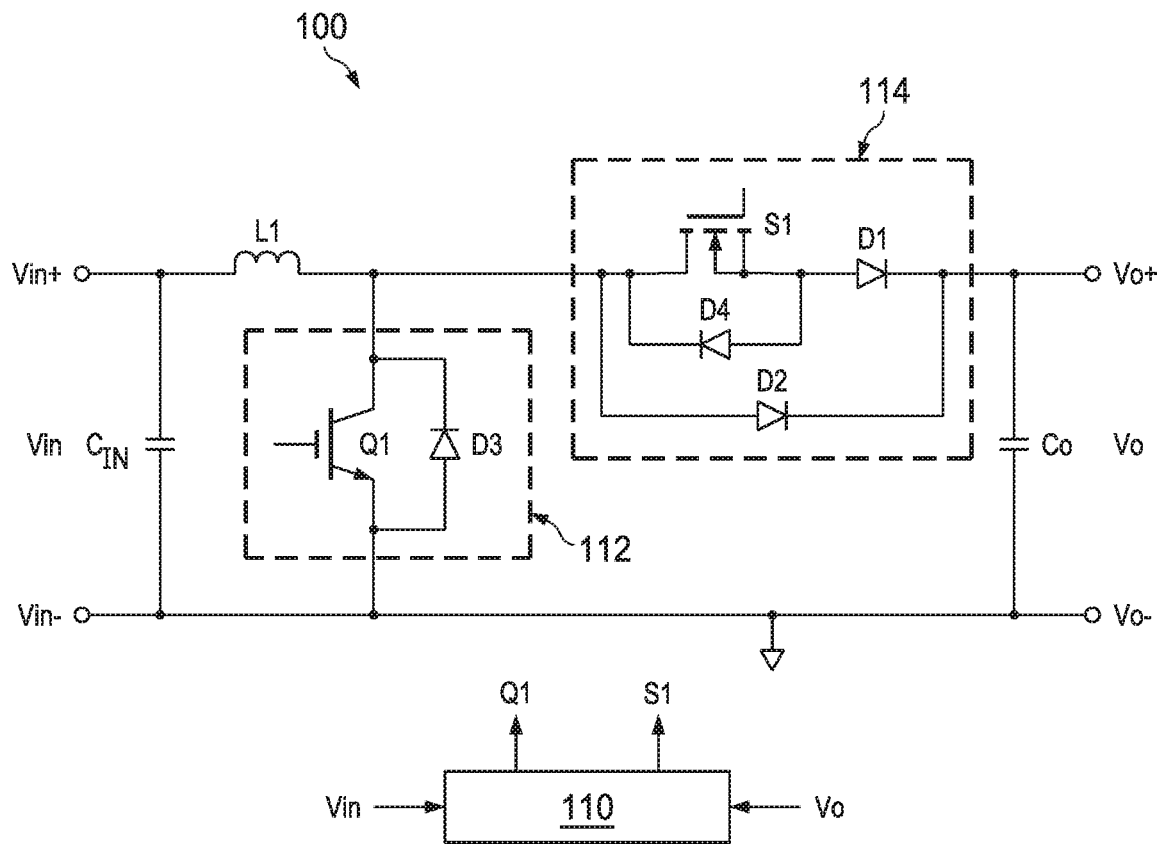
FIG. 2 illustrates a schematic diagram of the boost converter shown in FIG. 1 in accordance with various embodiments of the present disclosure.

FIG. 2 illustrates a schematic diagram of the boost converter shown in FIG. 1 in accordance with various embodiments of the present disclosure. The hybrid boost converter 100 comprises a first switching element 112, a second switching element 114, an inductor L1, an input capacitor $C_{IN}$ and an output capacitor Co. As shown in FIG. 2, the input capacitor $C_{IN}$ is across two output terminals (Vin+ and Vin−) of a power source Vin. The inductor L1 is connected between the input capacitor $C_{IN}$ and a common node of the first switching element 112 and the second switching element 114. The first switching element 112 has a first terminal connected to the inductor L1 and a second terminal connected to ground. The second switching element 114 is connected between the inductor L1 and the output capacitor Co. The output capacitor Co is employed to suppress voltage ripples and provide a steady voltage for various loads coupled to the hybrid boost converter 100.

In some embodiments, the first switching element 112 is implemented as an Insulated Gate Bipolar Transistor (IGBT) device Q1. As shown in FIG. 2, a collector of the IGBT device Q1 is connected to a common node of the inductor L1 and the second switching element 114. An emitter of the IGBT device Q1 is connected to ground. A gate of the IGBT device Q1 is configured to receive a gate drive signal from the controller 110.

As shown in FIG. 2, a third diode D3 is connected in parallel with the IGBT device Q1. The third diode D3 is employed to provide a reverse conducting path for the hybrid boost converter 100. In other words, the third diode D3 is an anti-parallel diode. In some embodiments, the third diode D3 is co-packaged with the IGBT device Q1. In alternative embodiments, the third diode D3 is placed outside the IGBT device Q1.

The second switching element 114 comprises a switch S1, a first diode D1, a second diode D2 and a fourth diode D4. In some embodiments, the switch S1 is implemented as a Metal Oxide Semiconductor Field Effect Transistor (MOSFET) device. More particularly, the switch S1 is an n-type MOSFET device. Throughout the description, the switch S1 is alternatively referred to as the MOSFET device S1.

As shown in FIG. 2, a drain of the MOSFET device S1 is connected to the inductor L1 as well as the IGBT device Q1. A source of the MOSFET device S1 is connected to an anode of the first diode D1. A gate of the MOSFET device S1 is configured to receive a gate signal from the controller 110.

FIG. 2 further illustrates that the MOSFET device S1 and the first diode D1 are connected in series to form a first conductive path between the inductor L1 to the output capacitor Co. The second diode D2 forms a second conductive path between the inductor L1 to the output capacitor Co. As shown in FIG. 2, the anode of the second diode D2 is connected to the drain of the MOSFET device S1. The cathode of the second diode D2 is connected to the cathode of the first diode D1. The first conductive path and the second conductive path are connected in parallel between the inductor L1 and the output capacitor Co.

In some embodiments, the fourth diode D4 is a body diode of the MOSFET device S1. In alternative embodiments, when the switch S1 is implemented as other suitable switching devices such as an IGBT device, a separate freewheeling diode may be required to be connected in parallel with its corresponding switch.

In operation, during the turn-on and turn-off transitions between the IGBT device Q1 and the MOSFET device S1, there may be two dead times. During these two dead times, both the IGBT device Q1 and the MOSFET device S1 are off. The second diode D2 functions as a freewheeling diode, which provides a conductive path for the current of the hybrid boost converter 100 during the dead times. In order to reduce switching losses during the turn-on and turn-off transitions, the second diode D2 is implemented as a diode having a short reverse recovery time and a low reverse recovery charge. The operation principle of the second diode D2 will be described below with respect to FIG. 3.

In some embodiments, the first diode D1 is implemented as is a low forward voltage drop diode such as a Schottky diode and the like. The second diode D2 is implemented as a low reverse recovery diode such as a silicon carbide diode, an ultrafast silicon diode and the like. In some embodiments, the second diode D2 has a shorter reverse recovery time and a lower reverse recovery charge than the first diode D1. The forward voltage drop of the second diode D2 is greater than the forward voltage drop of the first diode D1.

In some embodiments, the output voltage of the hybrid boost converter 100 is about 500 V. The voltage rating of the first diode D1 is in a range from about 600 V to about 650 V. The voltage rating of the second diode D2 is in a range from about 600 V to about 650 V. The voltage rating of the IGBT device Q1 is in a range from about 600 V to about 650 V. The voltage rating of the MOSFET device S1 is in a range from about 60 V to about 100 V.

In some embodiments, the voltage rating of the IGBT device Q1 is equal to 600 V. The voltage rating of the MOSFET device S1 is equal to 60 V. In other words, the voltage rating of the IGBT device Q1 is at least ten times greater than the voltage rating of the MOSFET device S1.

One advantageous feature of having a combination of a high voltage IGBT device (e.g., 600 V IGBT device Q1) and a low voltage MOSFET device (e.g., 60 V MOSFET device S1) is the low voltage MOSFET device S1 has a much lower turn-on resistance. The lower turn-on resistance of the MOSFET device S1 helps to improve the efficiency of the hybrid boost converter 100.

In operation, a current may continuously flow through the inductor L1. The controller 110 generates a signal to turn off the IGBT device Q1. In response to the turn-off signal applied to the gate of the IGBT device Q1, the IGBT device Q1 is turned off. In order to prevent the shoot through issue, a first dead time is placed after the turn-off of the IGBT device Q1. As described above, the MOSFET device S1, the first diode D1 and the second diode D2 form two conductive paths connected in parallel. During the first dead time, the MOSFET device S1 remains off. The turned off MOSFET device S1 blocks the current from entering the first diode D1. As a result, the current of the hybrid boost converter 100 completely flows through the second diode D2 during the first dead time. Since the second diode D2 is a high speed diode (a diode having a shorter reverse recovery time and a lower reverse recovery charge), the switching transition through the second diode D2 can reduce the switching losses of the hybrid boost converter 100.

Likewise, when the controller 110 generates a signal to turn off the MOSFET device S1, a second dead time is placed after the turn-off of the MOSFET device S1. During the second dead time, the current completely flows through the second diode D2. Since the second diode D2 is a high speed diode, the switching transition through the second diode D2 can reduce the switching losses of the hybrid boost converter 100.

One advantageous feature of having a low forward voltage drop diode (e.g., first diode D1) and a low reverse recovery diode (e.g., second diode D1) is the low reverse recovery diode helps to reduce the switching losses of the hybrid boost converter 100. On the other hand, the low forward voltage drop diode helps to reduce the conduction losses of the hybrid boost converter 100.

Figure 3:
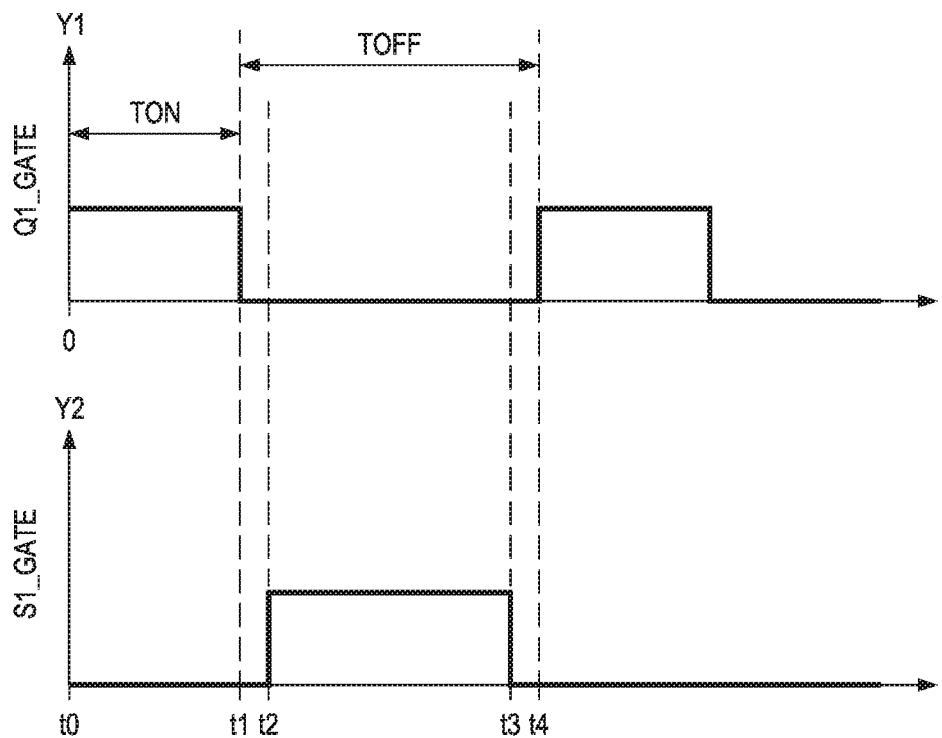
FIG. 3 illustrates the gate control signals of the switches of the hybrid boost converter shown in FIG. 2 in accordance with various embodiments of the present disclosure.

FIG. 3 illustrates the gate control signals of the switches of the hybrid boost converter shown in FIG. 2 in accordance with various embodiments of the present disclosure. The horizontal axis of FIG. 2 represents intervals of time. There may be two vertical axes. The first vertical axis Y1 represents the gate drive signal of the IGBT device Q1 shown in FIG. 2. The second vertical axis Y2 represents the gate drive signal of the MOSFET device S1 shown in FIG. 2.

As shown in FIG. 3, the time from t0 to t4 represents one switching cycle of the hybrid boost converter 100. The IGBT device Q1 is turned on from the time instant t0 to the time instant t1 as indicated by the gate drive signal of the IGBT device Q1. During the time instant t0 to the time instant t1, the MOSFET device S1 remains off as indicated by the gate drive signal of the MOSFET device S1.

The MOSFET device S1 is turned on from the time instant t2 to the time instant t3 as indicated by the gate drive signal of the MOSFET device S1. During the time instant t2 to the time instant t3, the IGBT device Q1 is off as indicated by the gate drive signal of the IGBT device Q1.

In one switching period shown in FIG. 3, there are two dead times. During these two dead times, both the IGBT device Q1 and the MOSFET device S1 are off. As shown in FIG. 3, a first dead time is from the time instant t1 to the time instant t2. The first dead time is employed to prevent shoot-through current from flowing in the hybrid boost converter 100 during the turn-off process of the IGBT device Q1. A second dead time is from the time instant t3 to the time instant t4. The second dead time is employed to prevent shoot-through current from flowing in the hybrid boost converter 100 during the turn-off process of the MOSFET device S1. Both the first dead time and the second dead time are predetermined. It should be noted that the first dead time and the second dead time may vary depending on different applications and design needs. In some embodiments, the switching frequency of the hybrid boost converter 100 is about 300 KHz. The first dead time is about 50 nanoseconds. The second dead time is about 50 nanoseconds.

During the first dead time and the second dead time, the current of the hybrid boost converter 100 flows through the second diode D2. The second diode D2 is a high speed diode, which can reduce the switching losses of the hybrid boost converter 100. On the other hand, during the turn-on time of the MOSFET device S1, the current flows through the first diode D1 having a low forward voltage drop. Such a low forward voltage drop helps to reduce the conduction losses of the hybrid boost converter 100.

Figure 4:
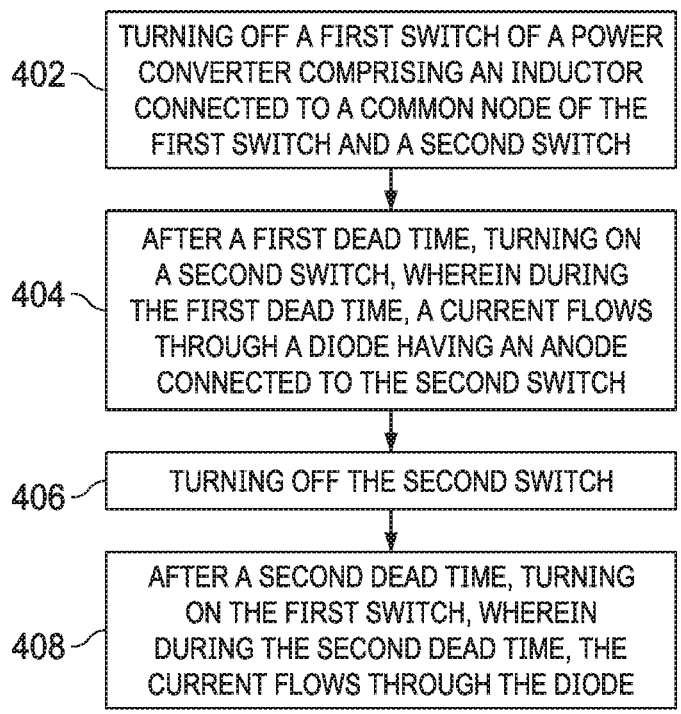
FIG. 4 illustrates a flow chart of a method for controlling the hybrid boost converter shown in FIG. 2 in accordance with various embodiments of the present disclosure.

FIG. 4 illustrates a flow chart of a method for controlling the hybrid boost converter shown in FIG. 2 in accordance with various embodiments of the present disclosure. This flowchart shown in FIG. 4 is merely an example, which should not unduly limit the scope of the claims. One of ordinary skill in the art would recognize many variations, alternatives, and modifications. For example, various steps illustrated in FIG. 4 may be added, removed, replaced, rearranged and repeated.

Referring back to FIG. 2, the hybrid boost converter 100 comprises a first switch Q1, a second switch S1, a first diode D1 and a second diode D2. The second switch S1 and the first diode D1 are connected in series between the inductor L1 and the output capacitor Co. The source of the second switch S1 is connected to the anode of the first diode D1. The second switch S1 and the first diode D1 form a first conductive path between the inductor L1 and the output capacitor Co. The second diode D2 forms a second conductive path between the inductor L1 and the output capacitor Co. The first conductive path and the second conductive path are connected in parallel between the inductor L1 and the output capacitor Co. In some embodiments, a conductive loss of the second conductive path is greater than a conductive loss of the first conductive path.

At step 402, upon receiving a turn-off signal of the first switch Q1 from a feedback loop (not shown), a controller (e.g., controller 110 shown in FIG. 2) turns off a first switch of a power converter. In some embodiments, the power converter is the hybrid boost converter 100. Referring back to FIG. 2, the hybrid boost converter 100 comprises a first switch Q1 implemented as an IGBT, a second switch S1 implemented as a MOSFET, a first diode D1, a second diode D2 and an inductor connected to a common node of the first switch and a second switch.

At step 404, after a first dead time, the controller turns on the second switch S1. During the first dead time, the current flows through the second diode D2. In some embodiments, the second diode D2 is a low reverse recovery diode such as a silicon carbide diode and the like. Such a low reverse recovery diode helps to reduce switching losses during the first dead time. Furthermore, after the current of the power converter flows through the second diode D2, the voltage stress across the second switch S1 is approximately equal to zero. As such, the second switch S2 can achieve zero voltage switching, thereby further reducing switching losses of the hybrid boost converter 100.

At step 406, upon receiving a turn-off signal of the second switch S1 from the feedback loop, the controller turns off the second switch S1. In response to the turn-off of the second switch S1, the current moves from the first conductive path to the second conductive path.

At step 408, after a second dead time, the controller turns on the first switch. During the second dead time, the current flows through the second diode D2.

In some embodiments, the first dead time is about 50 nanoseconds. The second dead time is about 50 nanoseconds. The first dead time and the second dead time given above are predetermined. The first dead time and/or the second dead time may vary depending on different applications and design needs.

In some embodiments, in order to achieve zero voltage switching, the first dead time is longer than the second dead time. For example, the first dead time is about 100 nanoseconds. The second dead time is about 50 nanoseconds. In other words, the first dead time is at least twice as long as the second dead time. Such a dead time arrangement may help to further improve the efficiency of the hybrid boost converter 100.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A converter comprising:
a first switching element and a second switching element coupled between an input power source and an output capacitor; and
an inductor coupled to a common node of the first switching element and the second switching element, wherein the second switching element comprises:
a first diode and a first switch connected in series between a first terminal and a second terminal of the second switching element; and
a second diode connected between the first terminal and the second terminal of the second switching element, wherein:
a source of the first switch is connected to an anode of the first diode;
a drain of the first switch is connected to an anode of the second diode; and
a cathode of the first diode is connected to a cathode of the second diode.

2. The converter of claim 1, further comprising:
the first switch is a Metal Oxide Semiconductor Field Effect Transistor (MOSFET) device; and
the first switching element is an Insulated Gate Bipolar Transistor (IGBT) device.

3. The converter of claim 1, wherein:
the first diode is a low forward voltage drop diode; and
the second diode is a low reverse recovery diode.

4. The converter of claim 1, wherein:
the first diode is a Schottky diode; and
the second diode is a silicon carbide (SiC) diode.

5. The converter of claim 1, wherein:
the inductor is connected between the input power source and the common node of the first switching element and the second switching element; and
the second switching element is connected between the inductor and the output capacitor.

6. The converter of claim 1, further comprising:
a third diode connected in parallel with the first switching element.

7. The converter of claim 1, wherein:
the second diode is configured to conduct a current flowing through the inductor during a first dead time between a turn-off of the first switching element and a turn-on of the first switch.

8. The converter of claim 1, wherein:
the second diode is configured to conduct a current flowing through during a second dead time between a turn-off of the first switch and a turn-on of the first switching element.

9. A method comprising:
turning off a first switch of a power converter comprising an inductor coupled to a common node of the first switch and a second switch of the power converter, wherein a second diode is connected in series with the second switch, and wherein the second diode and the second switch are connected between the inductor and an output capacitor of the power converter;
during a first dead time, flowing a current through a first diode having an anode connected to the second switch;
after the first dead time, turning on the second switch; and
during a second dead time after turning off the second switch, flowing the current through the first diode.

10. The method of claim 9, wherein:
the power converter is a boost converter.

11. The method of claim 9, further comprising:
during the first dead time and the second dead time, keeping the current from flowing through the second diode by maintaining the second switch off.

12. The method of claim 9, wherein:
the first switch is an Insulated Gate Bipolar Transistor (IGBT) device;
the second switch is a Metal Oxide Semiconductor Field Effect Transistor (MOSFET) device;
the first diode is a low reverse recovery diode; and
the second diode is a low forward voltage drop diode.

13. The method of claim 12, further comprising:
a source of the second switch is connected to an anode of the second diode;
a drain of the second switch is connected to an anode of the first diode; and
a cathode of the first diode is connected to a cathode of the second diode and further connected to the output capacitor of the power converter.

14. The method of claim 12, wherein:
a voltage rating of the first switch is at least ten times greater than a voltage rating of the second switch.

15. An apparatus comprising:
a first switch having a first terminal coupled to a positive terminal of a power source through an inductor and a second terminal coupled to a negative terminal the power source;
a second switch and a first diode connected in series and further coupled between the inductor and an output capacitor; and
a second diode coupled between a common node of the first switch and the second switch, and the output capacitor, wherein:
a collector of the first switch is connected to a drain of the second switch;
an emitter of the first switch is connected to the power source;
a source of the second switch is connected to an anode of the first diode;
an anode of the second diode is connected to the drain of the second switch; and
a cathode of the second diode is connected to a cathode of the first diode.

16. The apparatus of claim 15, wherein:
the first switch is an Insulated Gate Bipolar Transistor (IGBT) device;
the second switch is an n-type Metal Oxide Semiconductor Field Effect Transistor (MOSFET) device;
the first diode is a low forward voltage drop diode; and
the second diode is a low reverse recovery diode.

17. The apparatus of claim 15, wherein:
a voltage rating of the first switch is in a range from about 600 V to about 650 V; and
a voltage rating of the second switch is in a range from about 60 V to about 100 V.

* * * * *